(12) United States Patent
Ashino

(10) Patent No.: US 9,874,487 B2
(45) Date of Patent: Jan. 23, 2018

(54) PHYSICAL QUANTITY SENSOR AND METHOD OF MANUFACTURING PHYSICAL QUANTITY SENSOR

(71) Applicant: FUJI ELECTRIC CO., LTD., Kawasaki-shi (JP)

(72) Inventor: Kimihiro Ashino, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 668 days.

(21) Appl. No.: 14/451,684

(22) Filed: Aug. 5, 2014

(65) Prior Publication Data
US 2014/0338448 A1    Nov. 20, 2014

Related U.S. Application Data

(63) Continuation of application No. PCT/JP2013/052948, filed on Feb. 7, 2013.

(30) Foreign Application Priority Data

Feb. 9, 2012 (JP) ................................. 2012-026335

(51) Int. Cl.
*G01L 19/14* (2006.01)
*G01P 15/08* (2006.01)
(Continued)

(52) U.S. Cl.
CPC .............. *G01L 19/14* (2013.01); *B23K 10/02* (2013.01); *B23K 26/20* (2013.01); *B32B 37/12* (2013.01);
(Continued)

(58) Field of Classification Search
CPC ...... G01P 15/18; G01P 15/123; G01P 15/023; G01P 15/08; G01L 9/0054; G01L 9/0645;
(Continued)

(56) References Cited

U.S. PATENT DOCUMENTS 4,193,647 A * 3/1980 Guess .................. B06B 1/0666
29/25.35
4,382,377 A * 5/1983 Kleinschmidt ....... G01L 23/222
73/35.13
(Continued)

FOREIGN PATENT DOCUMENTS

CN      1480719 A      3/2004
CN      1831504 A      9/2006
(Continued)

OTHER PUBLICATIONS

European Search Report issued in European counterpart application No. EP13746930.0, dated Aug. 31, 2015.
(Continued)

*Primary Examiner* — Helen Kwok
(74) *Attorney, Agent, or Firm* — Rossi, Kimms & McDowell LLP

(57) ABSTRACT

A pressure sensor includes a socket portion and a nut portion which are integrally molded with resin, a screw portion which is tightly fixed to a side wall of an opening in a concave part of the nut portion by adhesive, and a sense element which is fixed to the screw portion and is disposed in the concave part of the nut portion. The socket portion, the nut portion and the screw portion constitute a package. A through hole introducing the pressure measurement target liquid is formed in the screw portion. An external lead-out terminal is fixed to the sense element. The external lead-out terminal passes through the through hole on a base of the concave part of the nut portion, and is tightly fixed to the socket portion with adhesive. The external lead-out terminal is a connection terminal to be connected with external wiring.

19 Claims, 14 Drawing Sheets

(51) Int. Cl.
*G01P 15/02* (2013.01)
*G01P 1/02* (2006.01)
*G01L 19/00* (2006.01)
*B23K 10/02* (2006.01)
*B23K 26/20* (2014.01)
*B32B 37/12* (2006.01)
*B32B 38/00* (2006.01)
*B32B 38/18* (2006.01)

(52) U.S. Cl.
CPC .......... *B32B 38/0008* (2013.01); *B32B 38/18* (2013.01); *G01L 19/0038* (2013.01); *G01L 19/143* (2013.01); *G01L 19/145* (2013.01); *G01P 1/023* (2013.01); *G01P 15/08* (2013.01); *H01L 2224/48091* (2013.01)

(58) Field of Classification Search
CPC ..... G01L 9/0084; G01L 9/0042; G01L 9/069; G01L 9/141; G01L 9/143; G01L 9/145
See application file for complete search history.

(56) References Cited

U.S. PATENT DOCUMENTS

| | | | | |
|---|---|---|---|---|
| 4,672,839 | A * | 6/1987 | Takeuchi | G01L 23/222 310/319 |
| 4,959,993 | A * | 10/1990 | Komurasaki | G01P 15/0907 310/329 |
| 5,212,421 | A * | 5/1993 | Hatton | G01H 11/08 310/324 |
| 5,226,325 | A * | 7/1993 | Komurasaki | G01L 23/222 310/324 |
| 5,329,819 | A * | 7/1994 | Park | G01L 9/0075 361/283.1 |
| 5,822,173 | A * | 10/1998 | Dague | G01L 9/0075 200/61.25 |
| 6,006,164 | A * | 12/1999 | McCarty | G01D 9/005 702/182 |
| 6,021,674 | A | 2/2000 | Roethlingshoefer et al. | |
| 6,622,559 | B2 * | 9/2003 | Baba | G01L 23/222 310/324 |
| 6,742,395 | B1 | 6/2004 | Borgers et al. | |
| 6,854,918 | B2 * | 2/2005 | Ueno | B29C 66/54 403/265 |
| 7,000,478 | B1 | 2/2006 | Zwollo et al. | |
| 8,022,806 | B2 | 9/2011 | Nishimura et al. | |
| 8,490,494 | B2 | 7/2013 | Parrotto et al. | |
| 2004/0028894 | A1 | 2/2004 | Ueno et al. | |
| 2004/0129078 | A1 * | 7/2004 | Kicher | G01P 15/123 73/514.14 |
| 2004/0200286 | A1 | 10/2004 | Mast | |
| 2006/0162461 | A1 | 7/2006 | Amore et al. | |
| 2008/0236307 | A1 | 10/2008 | Watanabe et al. | |

FOREIGN PATENT DOCUMENTS

| | | |
|---|---|---|
| CN | 101275860 A | 10/2008 |
| CN | 101373158 A | 2/2009 |
| CN | 102187191 A | 9/2011 |
| DE | 10228000 A1 | 1/2004 |
| GB | 1482494 A | 8/1977 |
| JP | 63-298129 A | 12/1988 |
| JP | 09-178595 A | 7/1997 |
| JP | 09-243655 A | 9/1997 |
| JP | 11-507135 A | 6/1999 |
| JP | 2004-205514 A | 7/2004 |
| JP | 2006-145468 A | 6/2006 |
| JP | 2006-215029 A | 8/2006 |

OTHER PUBLICATIONS

Office Action issued in CN201380008703.2, dated Jun. 15, 2015. English translation provided.
International Search Report issued in PCT/JP2013/052948 dated Mar. 5, 2013.

* cited by examiner

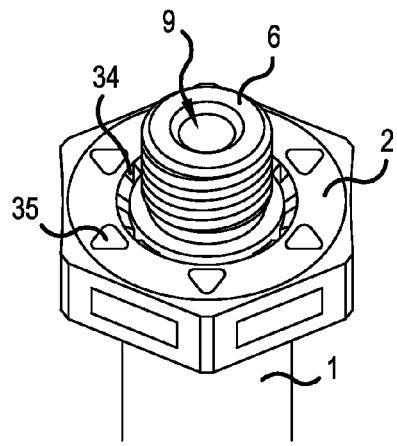
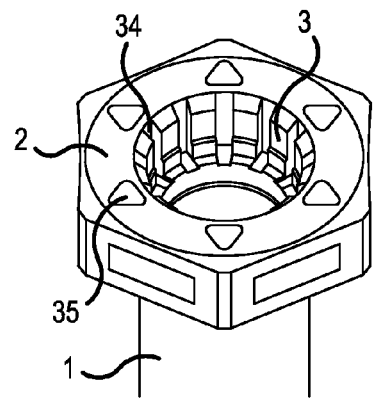
FIG.13A  FIG.13B
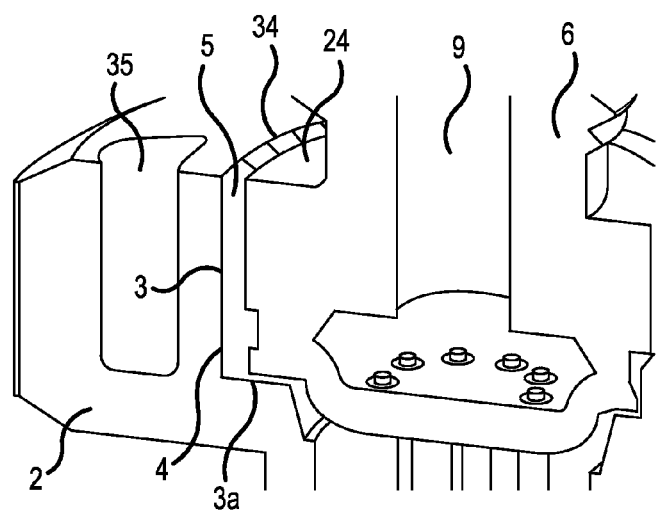
FIG.14

PHYSICAL QUANTITY SENSOR AND METHOD OF MANUFACTURING PHYSICAL QUANTITY SENSOR

CROSS-REFERENCE TO RELATED APPLICATIONS

This application is a continuation of International Application No. PCT/JP2013/052948, filed on Feb. 7, 2013, and is based on and claims priority to Japanese Patent Application No. JP 2012-026335, filed on Feb. 9, 2012. The disclosure of the Japanese priority application and the PCT application in their entirety, including the drawings, claims, and the specification thereof, are incorporated herein by reference.

BACKGROUND

Field of the Invention

Embodiments of the invention relate to a physical quantity sensor, such as a pressure sensor and an acceleration sensor, and a method of manufacturing the physical quantity sensor.

Discussion of the Background

Many physical quantity sensors are used for automobiles and industrial apparatuses. Physical quantity sensors include pressure sensors and acceleration sensors, which are often used in harsh environments exhibiting high temperatures and high humidities. First, a conventional pressure sensor is described.

FIGS. 7A and 7B are a plan view and a cross-sectional view of a main part of a first conventional pressure sensor 500. The pressure sensor 500 is constituted by a socket portion 51, a hexagonal nut portion 52, a screw portion 56, and a sense element 57, and the hexagonal nut portion 52 and the screw portion 56 are integrated.

The socket portion 51, where a signal terminal 60 for extracting sensor signals is installed, is formed by resin molding. The sense element 57 is sandwiched by the resin socket portion 51 and the metal screw portion 56, and the socket portion 51 is caulked by a caulking portion 52a that is attached to the hexagonal nut portion 52, so that the sense element 57 is secured. This structure is the same as the structure of Japanese Patent Application Laid-Open No. H9-178595 ("JP H9-178595").

FIGS. 8A and 8B are a plan view and a cross-sectional view of a main part of a second conventional pressure sensor 600. A difference from the pressure sensor 500 in FIGS. 7A and 7B is that a metal hexagonal nut portion 62 and a screw portion 66 are separated, and a socket portion 61, the screw portion 66 and the hexagonal nut portion 62 are formed independently from one another. The screw portion 66 is separated from the hexagonal nut portion 62 because the material of the screw portion 66 may be different in some cases depending on intended use. The sense element 57, the resin socket portion 61 and the metal screw portion 66 are held together by the hexagonal nut portion 62, and are caulked respectively by the caulking portion 62a that is attached to the upper part and the lower part of the hexagonal nut portion 62.

FIGS. 9A and 9B are a plan view and a cross-sectional view of a main part of a third conventional pressure sensor 700. A difference from the pressure sensor 600 in FIGS. 8A and 8B is that a metal screw portion 76 and a metal hexagonal nut portion 72 are separated but integrated by brazing or welding. This configuration is for transferring the rotational force of the hexagonal nut portion 72 to the screw portion 76 with certainty. The socket portion 71, the sense element 57 and the screw portion 76 are secured by caulking a caulking portion 72a, attached to the upper part of the hexagonal nut portion 72, toward the socket portion 71.

FIG. 10 is a cross-sectional view of a main part of each sense element 57 in FIGS. 7B, 8B and 9B. The sense element 57 in FIG. 10 has a configuration for use in a semiconductor type pressure sensor. This sense element 57 is constituted by a semiconductor strain gauge type pressure sensor element 67, a metal housing box 63 which houses the pressure sensor element 67 and has a diaphragm 69, an external lead-out terminal (terminal for external connection) 60 that passes through the housing box 63, and an insulating resin 83 that blocks a through hole 82 where the external lead-out terminal 60 passes through. The pressure sensor element 67 and the external lead-out terminal 60 are connected by a bonding wire 70. For the pressure sensor element 67, a capacitor type pressure sensor may be used, although this is not illustrated.

To mount the pressure sensor 500, 600 or 700 to a mounting member (e.g. chassis of an engine), rotational torque (rotational force) is applied to the metal screw portion 56, 66 or 76 (male screw) to introduce a pressure medium via the hexagonal nut portion 52, 62 or 72, so as to be secured to a concave part of the mounting member (not illustrated) where a screw (female screw) is formed. In this case, a commercial torque wrench, for example, is used as a tool for this operation.

In this way, the rotational torque is applied to the screw portion 56, 66 or 76 and the hexagonal nut portion 52, 62 or 72 when the pressure sensor 500, 600 or 700 is mounted. In the stage when the mounting is completed, the screw portion 56, 66 or 76 no longer rotates, and the rotation of the screw portion 56, 66 or 76 stops. When the rotation of the screw portion 56, 66 or 76 stops, further rotational torque is applied to the hexagonal nut portion 52, 62 or 72 via the torque wrench, and as a result a large rotational force is applied to the screw portion 56, 66 or 76 and the hexagonal nut portion 52, 62 or 72. This means that high mechanical strength to withstand this rotational force is required for the screw portion 56, 66 or 76 and the hexagonal nut portion 52, 62 or 72. To satisfy this requirement, brass, stainless steel, plated iron or the like is normally used for the metal screw portion 56, 66 or 76 and the metal hexagonal nut portion 52, 62 or 72.

To fabricate the metal screw portion 56, 66 or 76 and the metal hexagonal nut portion 52, 62 or 72, forging, die casting that melts metal and injects the melted metal into a die, or cutting, for example, can be used. However the dimensional accuracy of the screw portion 56, 66 or 76 and the hexagonal nut portion 52, 62 or 72 cannot be implemented merely by forging and die casting, cutting must be added as the secondary fabrication after the forging and die casting in order to realize accuracy.

The pressure sensor disclosed in JP H9-178595 includes a metal body (the hexagonal nut portion integrated with the screw portion) where a through hole is created, and a sense element is installed on the body. The sense element includes a resin base and a metal pressure introduction pipe which has an inflow port where measurement target fluid flows in, and is fixed to the base such that the base end of the pressure introduction pipe is disposed on one side of the through hole. Further, the sense element includes a pressure sensor element that is tightly fixed to the end face of the base end of the pressure introduction pipe and converts the pressure into an electric signal by blocking the inflow port. The sense element also has a terminal which is electrically connected with the pressure sensor element, and is fixed to the base. The pressure sensor disclosed in JP H9-178595 is a pressure sensor that includes a sense element having this configuration, and which measures the pressure of the fluid, wherein a side wall of the through hole and the outer periphery of the pressure introduction pipe are joined airtight (joint portion). Thereby a pressure sensor which can decrease the temperature characteristic measuring time of the pressure sensor element required for temperature compensation can be provided. In JP H9-178595, the socket portion (connector portion) is made of resin, and the hexagonal nut portion (body) is made of metal. In other words, JP H9-178595 corresponds to FIGS. 7A and 7B.

However, as described above, expensive metal (brass and stainless steel) is often used as a material of the hexagonal nut portion 52, 62 or 72 and the screw portion 56, 66 or 76 of the pressure sensor 500, 600 or 700 in FIGS. 7A to 9B. Therefore it is very difficult to stabilize material cost due to the influence of market price fluctuations of metal materials.

Further, in fabrication of the hexagonal nut portion 52, 62 or 72 and the screw portion 56, 66 or 76, it is necessary to combine forging processing, which is the primary fabrication, and cutting processing, which is the secondary fabrication. This requires extra fabrication cost and results in an increase in the manufacturing cost.

Moreover, according to the configuration of the pressure sensor 500, 600 or 700 in FIGS. 7A to 9B, the sense element 57 is sandwiched by the socket portion 51, 61 or 71 and the screw portion 56, 66 or 76, and the sense element 57 is secured by caulking performed by the caulking portion 52a, 62a or 72a of the metal hexagonal nut portion 52, 62 or 72. However the force to hold the sense element 57 depends on the fabrication dimensions of the caulking portion 52a, 62a or 72a formed by bending the upper edge or upper and lower edges (hereafter called "edge") of the hexagonal nut portion 52, 62 or 72, inward. The dimensional accuracy of the caulking is low, which means that holding the sense element 57 with a stable force is difficult. This causes a quality dispersion of the pressure sensor 500, 600 or 700.

The caulking portion 52a, 62a or 72a of the metal hexagonal nut portion 52, 62 or 72 is contacted with the resin socket portion 51, 61 or 71 by caulking the edge of the hexagonal nut portion 52, 62 or 72, but the sealability inside the package enclosed by the socket portion 51, 61 or 71, the hexagonal nut portion 52, 62 or 72 and the screw portion 56, 66 or 76 constituting the package, is low. Therefore a case may arise in which such liquid as water enters into the package from the outer environment. As the dotted line 80 in FIG. 10 indicates, when such liquid as water adheres to the metal housing box 63 constituting the sense element 57, the housing box 63 corrodes, and when the liquid adheres to an area of the housing box 63 where the external lead-out terminal 60 passes through, insulation between the external lead-out terminal 60 and the metal housing box 63 becomes difficult.

On the other hand, if the sealability inside the package is improved by coating the contact area of the caulking portion 52a, 62a or 72a with resin, or by disposing O-rings in a gap between the hexagonal nut portion 52, 62 or 72 and the socket portion 51, 61 or 71, or between the hexagonal nut portion 52, 62 or 72 and the screw portion 56, 66 or 76, as shown in FIGS. 7B, 8B and 9B using dotted lines 81, manufacturing cost increases.

In the configuration of JP H9-178595 as well, the resin socket portion and the metal hexagonal nut portion are separated, therefore sealability inside the package is low, and manufacturing cost is high since metal is used for the hexagonal nut portion and the screw portion.

SUMMARY OF THE INVENTION

Embodiment's of the present invention provide a physical quantity sensor that can reduce cost, and a method of manufacturing the physical quantity sensor.

A physical quantity sensor according to this invention includes: a package that includes a socket portion, a nut portion and a screw portion; and a sense element, and has the following characteristics. The socket portion is a portion of connection with external wiring. Rotational force, that is a mounting torque, is transferred from a tool to the nut portion. And the rotational force is transferred from the nut portion to the screw portion. The screw portion has an introduction hole introducing pressure measurement target gas or pressure measurement target liquid, and has a pedestal on one end of the introduction hole. The sense element is fixed to the pedestal so as to block the introduction hole, and is housed in a concave part of the nut portion. The socket portion and the nut portion are an integrated resin member. And the screw portion is a metal member. An inner side wall of the concave part of the nut portion and a side wall of the pedestal are bonded with adhesive.

In the physical quantity sensor according to this invention, the sense element may include an element that senses pressure or acceleration, a housing box which houses the element, and a terminal which is electrically connected with the element, and is disposed passing through the housing box.

In the physical quantity sensor according to this invention, the side wall of the pedestal may have a rough surface. In the physical quantity sensor according to this invention, a groove, extending in a direction from an opening edge on the side opposite to a base toward the base, may be provided on the inner side wall face of the concave part of the nut portion.

In the physical quantity sensor according to this invention, a convex part or a concave part may be provided on the side wall of the pedestal, and a concave part or a convex part, to which the convex part or the concave part on the side wall of the pedestal is fitted, may be provided on an inner side wall face of the concave part of the nut portion.

In the physical quantity sensor according to this invention, a planar shape of the concave part of the nut portion may be a polygon, and a planar shape of the pedestal may be a polygon that is fitted to the concave part of the nut portion.

In the physical quantity sensor according to this invention, a planar shape of may be a polygon from the opening edge on the side opposite to the base of the concave part of the nut portion to a predetermined depth, and a planar shape of the sense element may be a polygon that is fitted to the area of the concave part of the nut portion where the planar shape is the polygon.

In the physical quantity sensor according to this invention, the nut portion and the sense element may be bonded by fitting the concave part of the nut portion to at least a part of the sense element, and filling adhesive into a gap formed in the fitted portion.

In another embodiment, a physical quantity sensor according to this invention includes: a package including a socket portion, a nut portion and a screw portion; and a sense element, and has the following characteristics. The socket portion is a portion of connection with external wiring. Rotational force, that is a mounting torque, is transferred from a tool to the nut portion. The rotational force is transferred from the nut portion to the screw portion, and the screw portion has a pedestal on one end thereof. The sense element is disposed on the pedestal. The socket portion and the nut portion are an integrated resin member. The screw portion is a metal member. An inner side wall of the concave part of the nut portion and a side wall of the pedestal are bonded with adhesive.

In the physical quantity sensor according to the invention, the screw portion may have an introduction hole introducing pressure measurement target gas or pressure measurement target liquid. The sense element includes a metal diaphragm, a metal housing box and an element housed in the housing box. The diaphragm is welded to the pedestal so as to block the introduction hole. The housing box is welded to the diaphragm so as to form a space inside the sense element. Suitably, the space may be filled with liquid.

In the physical quantity sensor according to this invention, the side wall of the pedestal may have a rough surface. In the physical quantity sensor according to this invention, a groove, extending in a direction from the opening-edge on the side opposite to a base toward the base, may exist on the inner side wall face of the concave part of the nut portion.

In the physical quantity sensor according to this invention, a step may be formed on the inner side wall of the concave part of the nut portion at the opening edge on the side opposite to the base on the socket portion side, and the step makes the opening width of the opening edge on the side opposite to the base of the concave part of the nut portion to be wider than the opening width on the base side. In the physical quantity sensor according to this invention, the upper surface of the sense element may be bonded to the step with adhesive.

In the physical quantity sensor according to this invention, a step may be formed on the inner side wall of the concave part of the nut portion at the opening edge on the side opposite to the base on the socket portion side, and the step makes the opening width of the opening edge on the side opposite to the base of the concave part of the nut portion to be wider than the opening width on the base side. In the physical quantity sensor according to this invention, the upper surface of the sense element may be bonded to the step with adhesive.

In another embodiment, a method of manufacturing the physical quantity sensor according to this invention has the following characteristics. First a step of integrally molding the socket portion and the nut portion with resin is performed. Then a step of fixing the sense element to the surface of the metal screw portion is performed. Then a step of fitting the screw portion to the concave part of the nut portion, and bonding the screw portion and the nut portion with adhesive is performed.

In the method of manufacturing the physical quantity sensor according to this embodiment, the sense element may be fixed to the surface of the screw portion by laser welding or plasma welding.

In another embodiment, a method of manufacturing the physical quantity sensor according to this invention has the following characteristics. First a step of integrally molding the socket portion and the nut portion with resin is performed. Then a step of fixing the diaphragm and the housing box to the screw portion by welding the screw portion, the diaphragm and the housing box in a state where the housing box is stacked onto the surface of the screw portion via the diaphragm is performed. Then a step of fitting the screw portion to the concave part of the nut portion, and bonding the screw portion and the nut portion with adhesive is performed.

According to the physical quantity sensor and the method of manufacturing the physical quantity sensor according to embodiments of this invention, the socket portion and the nut portion are integrally molded with resin, and the screw portion and the nut portion are bonded with adhesive, whereby physical quantity sensors, such as a pressure sensor and an acceleration sensor, with better sealability inside a package, can be provided at low cost.

BRIEF DESCRIPTION OF THE DRAWINGS

FIGS. 13A and 13B are perspective views depicting a configuration of the socket portion 1 of the pressure sensor 110 in FIG. 11.

FIG. 14 is a perspective view depicting an internal configuration of the socket portion 1 of the pressure sensor 110 in FIG. 11.

DESCRIPTION OF ILLUSTRATED EMBODIMENTS

Figure 1A:
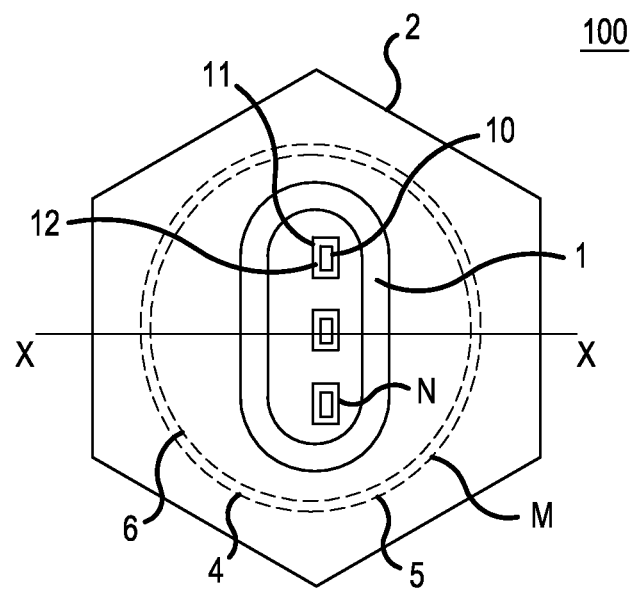
FIGS. 1A and 1B are diagrams depicting a configuration of a pressure sensor 100 according to an embodiment of this invention.
Figure 1B:
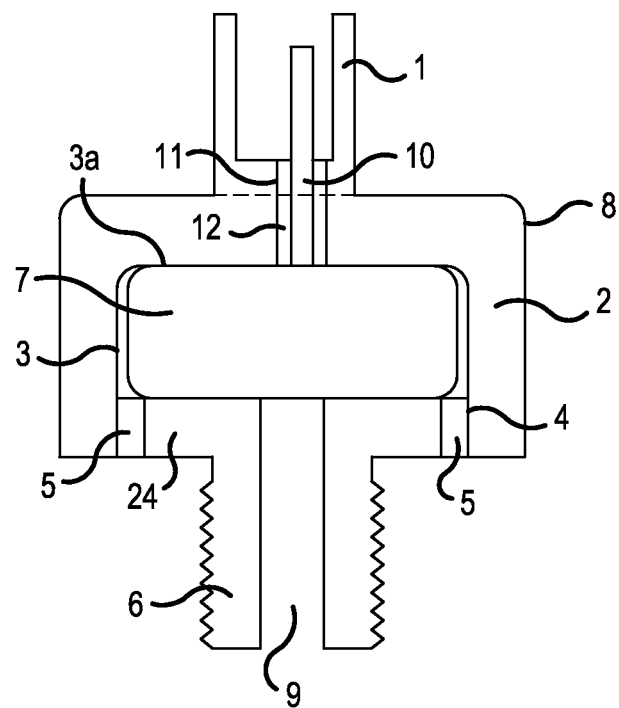

Exemplary embodiments of a physical quantity sensor and a method of manufacturing the physical quantity sensor according to this invention will now be described with reference to the accompanying drawings. In the following description of the embodiments and the accompanying drawings, the same composing elements are denoted with the same reference symbols, and redundant description thereof is omitted. In the following description, a pressure sensor is described as an example of the physical quantity sensor, but the present invention can be applied to an acceleration sensor or the like as well A physical quantity sensor according to an embodiment of the invention will be described using a pressure sensor as an example. FIGS. 1A and 1B are diagrams depicting a configuration of the pressure sensor 100 according to an embodiment of this invention. FIG. 1A is a plan view of a main part, and FIG. 1B is a cross-sectional view of the main part sectioned at the X-X line in FIG. 1A.

This pressure sensor 100 has a socket portion 1 and a nut portion 2 having a hexagonal planar shape, which are integrally molded with resin, a screw portion 6 which is tightly bonded to a side wall 4 of an opening of a concave part 3 of the nut portion 2 with the adhesive 5, and a sense element 7 which is fixed to a pedestal 24 of the screw portion 6, and is disposed in the concave part 3 of the nut portion 2. The socket portion 1, the nut portion 2 and the screw portion 6 constitute a package 8. The socket portion 1 is a portion of connection with external wiring (not illustrated). A through hole 9 to introduce pressure measurement target fluid is formed in the screw portion 6, and an external lead-out terminal 10 is fixed to the sense element 7. The external lead-out terminal 10 passes through a through hole 11 which is formed from a base 3a of the concave part 3 to the socket portion 1, and is tightly fixed to the socket portion 1 with the adhesive 12, so as to be a connection terminal to connect the external wiring (not illustrated).

Figure 2:
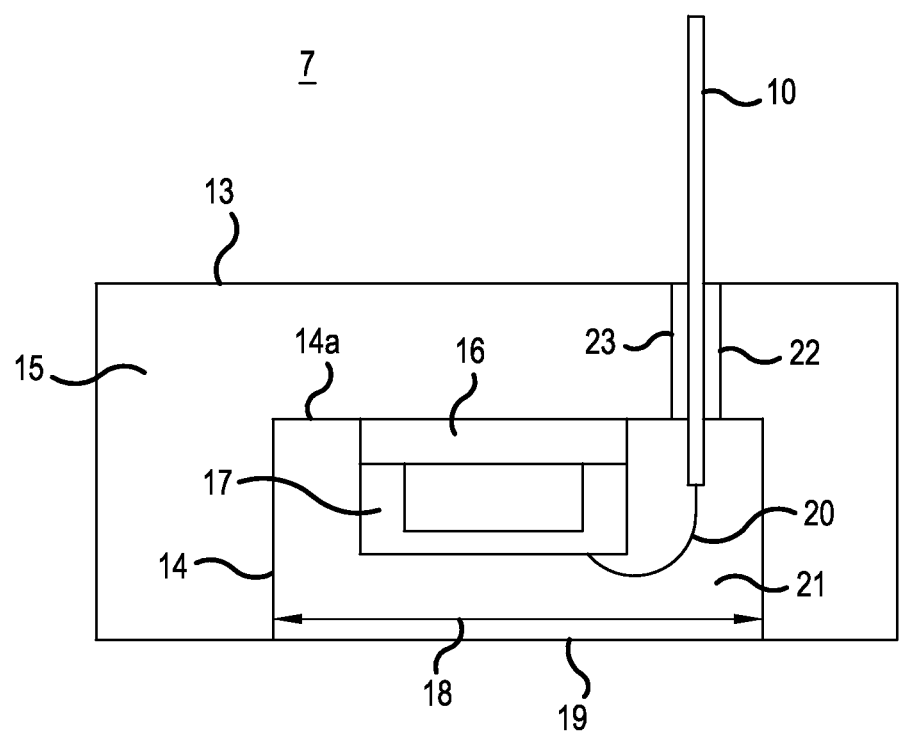
FIG. 2 is a cross-sectional view of a main part of a sense element 7 in FIG. 1B.

FIG. 2 is a cross-sectional view of a main part of the sense element 7 in FIG. 1B. The sense element 7 has a metal support portion 15, a semiconductor strain gauge type pressure sensor element 17, a metal diaphragm 19, the above-mentioned external lead-out terminal 10, and liquid 21 that transfers pressure to the pressure sensor element 17. The support portion 15 has a concave part 14 constituting a housing box 13 (hereafter called "concave part 14 of the housing box 13"). The pressure sensor element 17, which senses pressure, is an element that is supported by a glass substrate 16. The glass substrate 16 is fixed to a base 14a of the concave part 14 of the housing box 13.

The external lead-out terminal 10 is connected with the pressure sensor element 17 via a bonding wire 20, and passes through the housing box 13. Further, the external lead-out terminal 10 is fixed to the housing box 13 by an insulating member 23 that blocks a through hole 22. The insulating member 23 is made of glass, for example. The diaphragm 19 blocks an opening 18 of the concave part 14 of the housing box 13, and constitutes the housing box 13. The diaphragm 19 is a wavy thin metal plate. The liquid 21 fills the concave part 14 of the housing box 13. The pressure sensor element 17 may be a capacitor type.

As mentioned above, the sealability inside the package 8 improves by integrally molding the socket portion 1 and the nut portion 2 constituting the package 8 with resin, and bonding the screw portion 6 and the nut portion 2 with the adhesive 5. Improvement of the sealability inside the package 8 enhances the reliability of the sense element 7 disposed inside the package 8, and implements a highly reliable pressure sensor 100.

Further, the nut portion 2 and the screw portion 6 are bonded with the adhesive 5, therefore the fixing strength between the nut portion 2 and the screw portion 6 with the adhesive 5 is stably secured. Moreover, the gap M between the nut portion 2 and the screw portion 6 is filled with the adhesive 5, and the gap N between the external lead-out terminal 10 and the socket portion 1 is filled with the adhesive 12, hence the entry of water or the like into the gaps M and N is prevented, and a highly reliable pressure sensor 100 can be implemented.

Furthermore, the socket portion 1 and the nut portion 2 are integrally molded, which decreases the manufacturing man-hours and reduces the manufacturing cost of the pressure sensor 100. Since the nut portion 2 is made of resin, the number of metal members decreases, cost is reduced, and the influence of market price fluctuations can be mitigated.

The planar shape of the nut portion 2 is a hexagon, assuming that a commercial tool is used, but shape is not limited to a hexagon. If a dedicated tool is used, the planar shape of the nut portion 2 may be any polygonal shape, such as a square or pentagon. Any planar shape can be easily formed since the nut portion 2 is molded with resin.

Figure 3A:
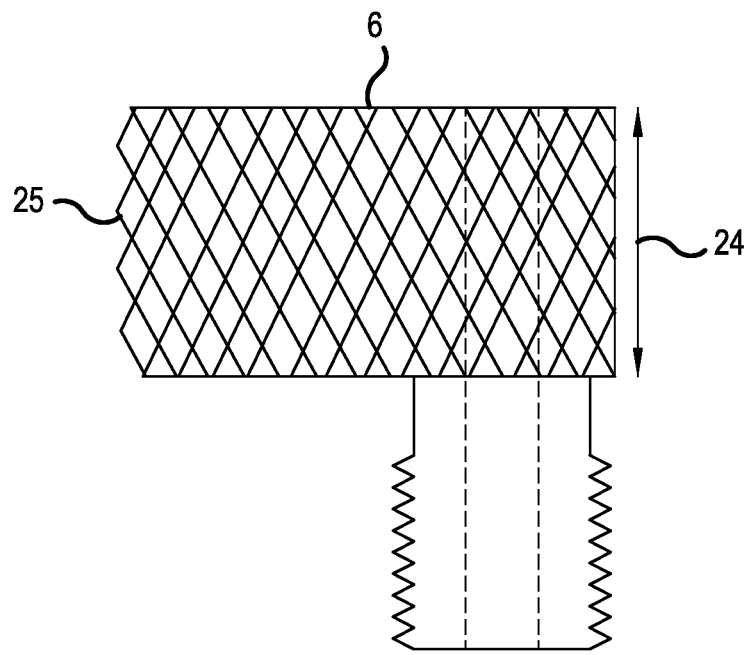
FIGS. 3A and 3B are diagrams depicting a first method to prevent slipping between the nut portion 2 and the screw portion 6 in FIGS. 1A and 1B in the rotation direction.
Figure 3B:
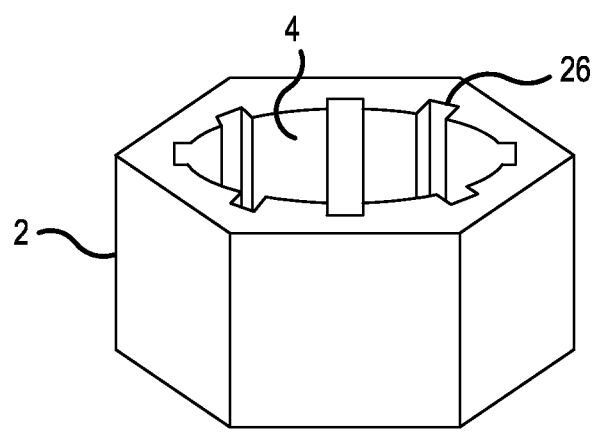

FIGS. 3A and 3B are diagrams depicting a first method to prevent slipping between the nut portion 2 and the screw portion 6 in FIGS. 1A and 1B in the rotation direction. FIG. 3A is a cross-sectional view of a main part where the rough surface 25 is formed on the pedestal 24 of the screw portion 6 by knurling, and FIG. 3B is a perspective view of the main part where concave parts 26 are formed on the side wall 4 of the opening of the concave part 3 of the nut portion 2. The concave part (groove) 26 illustrated in FIG. 3B is formed vertical to the opening surface of the opening of the concave part 3 of the nut portion 2, but the form is not limited to this, and a plurality of concave parts, which are inclined from the opening surface of the opening of the concave part 3 in one direction at a predetermined angle, or a screw structure, may be used.

The adhesive 5 enters the knurled rough surface 25 on the side face of the pedestal 24, which is disposed on one end of the screw portion 6, and the concave parts 26 formed on the side wall 4 of the opening of the concave part 3 of the nut portion 2, whereby the bonding of the adhesive 5 and the nut portion 2 increases. As a result, slip-rotation of the nut portion 2, when the nut portion 2 is rotated, can be prevented, and the rotational force applied to the nut portion 2 is transferred to the screw portion 6 with certainty.

Figure 4A:
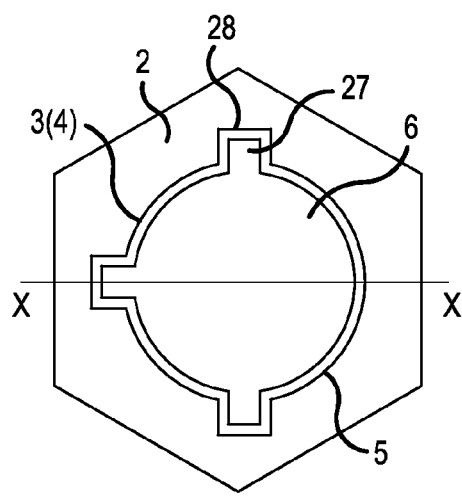
FIGS. 4A, 4B, 4C, and 4D are diagrams depicting a second method to prevent slipping between the nut portion 2 and the screw portion 6 in FIGS. 1A and 1B in the rotation direction.
Figure 4B:
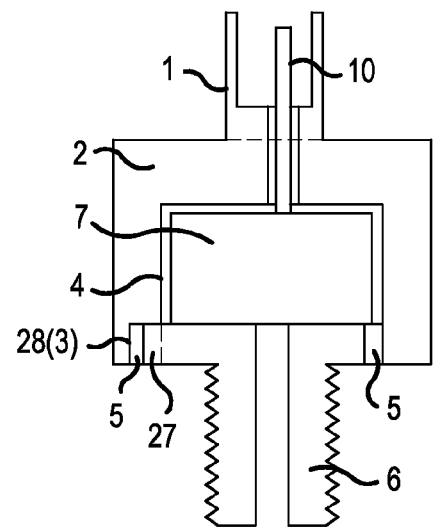
Figure 4C:
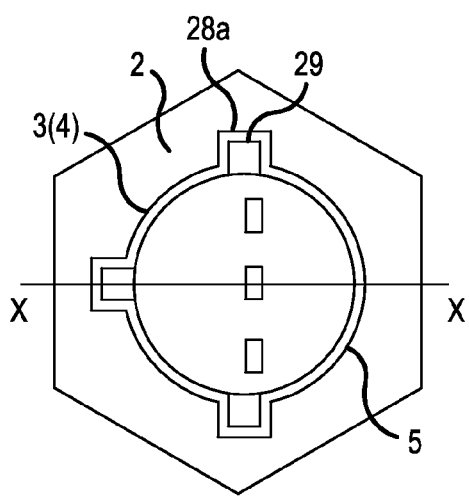
Figure 4D:
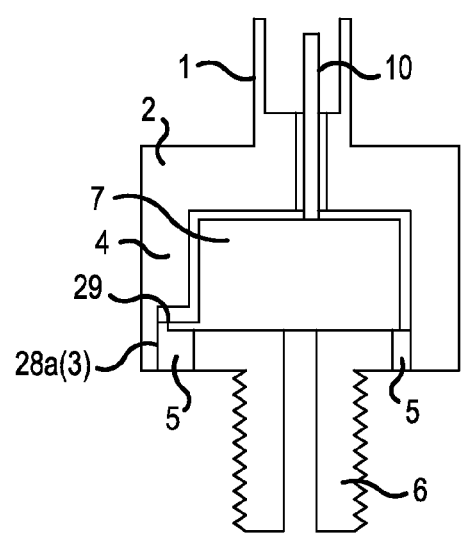

FIGS. 4A to 4D are diagrams depicting a second method to prevent slipping between the nut portion 2 and the screw portion 6 in FIGS. 1A and 1B in the rotation direction. FIGS. 4A and 4B are a plan view and a cross-sectional view, respectively, depicting a configuration where convex parts 27 are formed on a side wall of the pedestal 24 of the screw portion 6. FIGS. 4C and 4D are a plan view and a cross-sectional view, respectively, depicting a configuration where convex parts 29 are formed on the side wall of the sense element 7. FIGS. 4B and 4D are cross-sectional views of the entire sensor sectioned in line X-X in FIGS. 4A and 4C respectively.

In FIGS. 4A and 4B, the convex parts 27 are formed on the side wall of the pedestal 24 of the screw portion 6, and the concave parts 28, to which the convex part 27 are fitted, are formed on the side wall 4 of the opening of the concave part 3 of the nut portion 2, whereby the rotational force applied to the nut portion 2 can be transferred to the screw portion 6 with certainty.

In FIGS. 4C and 4D, the convex parts 29 are formed on the side wall of the sense element 7, and the concave parts 28a, to which the convex parts 29 are fitted, are formed on the side wall 4 of the opening of the concave part 3 of the nut portion 2. Since the sense element 7 is firmly fixed to the screw portion 6 by welding or the like, the rotational force applied to the nut portion 2 via the sense element 7 can be transferred to the screw portion 6 with certainty. In this example, three convex parts 27 or 29 are formed, but the present invention is not limited to this number. Further, in the FIGS. 4C and 4D, the convex parts 29 are formed only around the opening of the concave part 14 of the housing box 13 of the sense element 7 illustrated in FIG. 2, but the convex parts 29 may be formed from the opening of the concave part 14 of the housing box 13 to the base 14a of the housing box 13.

Figure 5A:
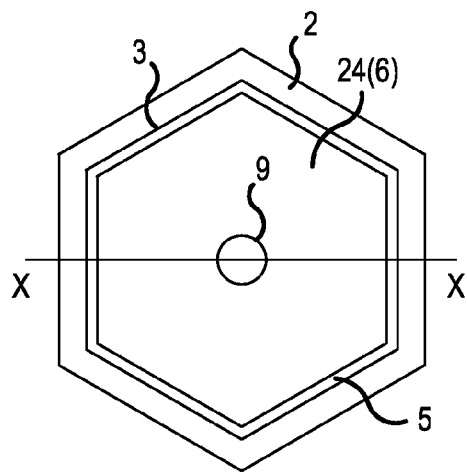
FIGS. 5A, 5B, 5C, and 5D are diagrams depicting a third method to prevent slipping between the nut portion 2 and the screw portion 6 in FIGS. 1A and 1B in the rotation direction.
Figure 5B:
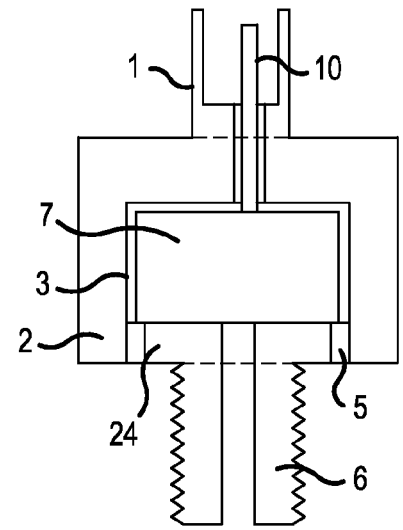
Figure 5C:
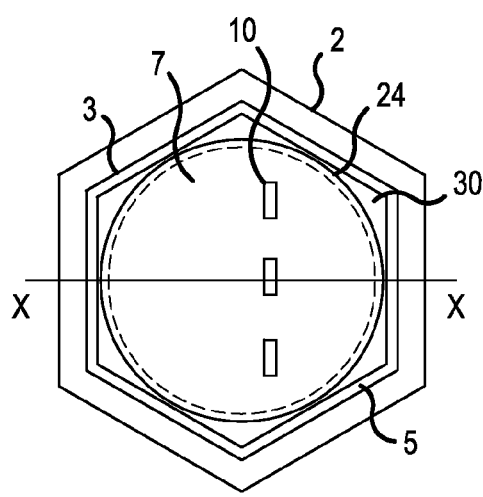
Figure 5D:
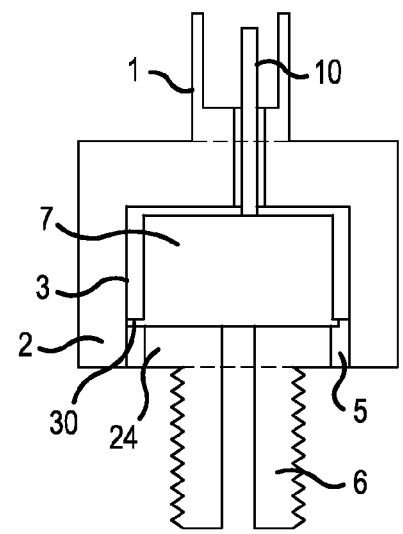

FIGS. 5A to 5D are diagrams depicting a third method to prevent slipping between the nut portion 2 and the screw portion 6 in FIGS. 1A and 1B in the rotation direction. FIG. 5A is a plan view of a main part where the planar shape of the pedestal 24 of the screw portion 6 is a hexagon, and FIG. 5C is a plan view of a main part where the planar shape of the convex part 30 in the lower part of the side wall of the sense element 7 is a hexagon. FIGS. 5B and 5D are cross-sectional views of the entire sensor sectioned in line X-X in FIGS. 5A and 5C, respectively.

In FIGS. 5A and 5B, the planar shape of the pedestal 24 of the screw portion 6 is a hexagon, and the planar shape of the concave part 3 of the nut portion 2 is a hexagon so as to fit with the pedestal 24. By this configuration, the rotational force applied to the nut portion 2 can be transferred to the screw portion 6 with certainty.

In FIGS. 5C and 5D, the planar shape of the convex part 30 in the lower part of the side wall of the sense element 7 is a hexagon, and the planar shape of the concave part 3 of the nut portion 2 is a hexagon, so as to fit with the convex part 30. By this configuration, the rotational force applied to the nut portion 2 can be transferred to the screw portion 6 with certainty.

In FIGS. 5C and 5D, only the planar shape around the opening of the concave part 14 of the housing box 13 of the sense element 7 illustrated in FIG. 2 is a hexagon, but the planar shape of the entire housing box 13 may be a hexagon.

In FIGS. 5A to 5D, the planar shape is not limited to a hexagon, but may be such a polygon as a pentagon or an octagon to acquire a similar effect.

As described above, according to embodiments of the invention, the fixing strength of the screw portion and the nut portion, and the sealability inside the package improve by bonding the screw portion and the nut portion with adhesive, whereby reliability can be enhanced. Further, according to embodiments of the invention, the socket portion and the nut portion are integrally molded, hence manufacturing man-hours can be decreased and manufacturing cost can be reduced. Furthermore, according to embodiments of the invention, the nut portion is made of resin, hence the number of metal members decreases, and cost is reduced compared to the prior art.

Figure 6A:
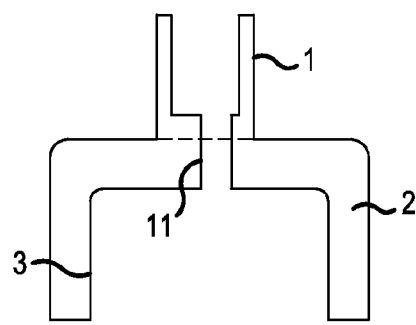
FIGS. 6A, 6B, and 6C are cross-sectional views of main part manufacturing steps depicting the method of manufacturing the pressure sensor 100 according to an embodiment of this invention in sequence.
Figure 6B:
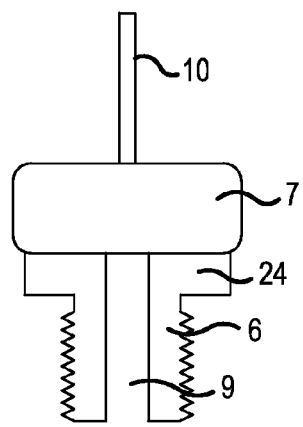
Figure 6C:
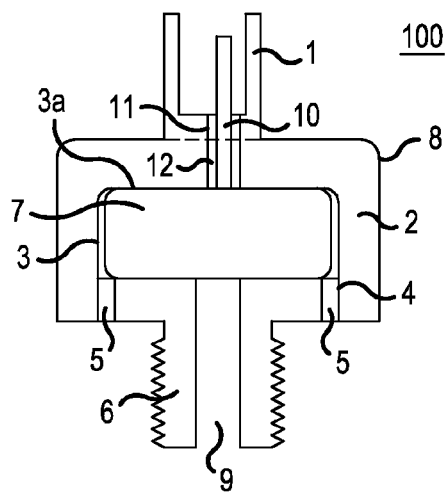
Figure 7A:
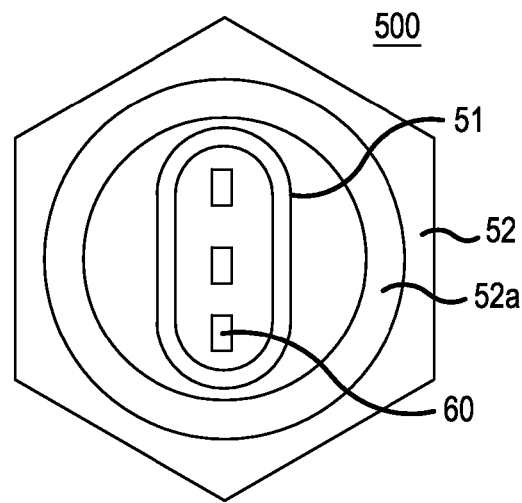
FIGS. 7A and 7B are a plan view and a cross-sectional view of a main part of a first conventional pressure sensor 500.
Figure 7B:
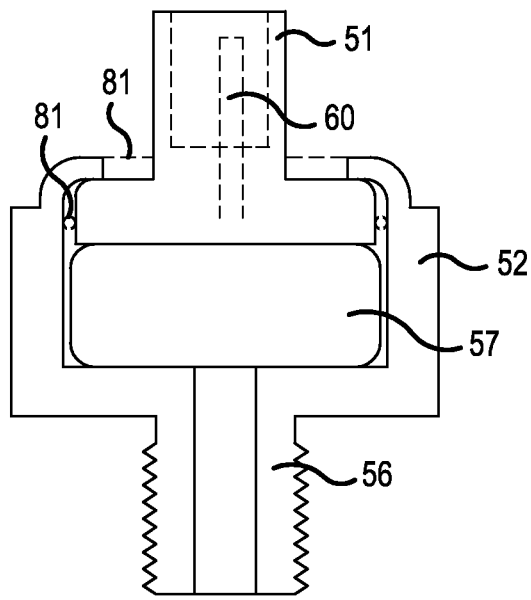
Figure 8A:
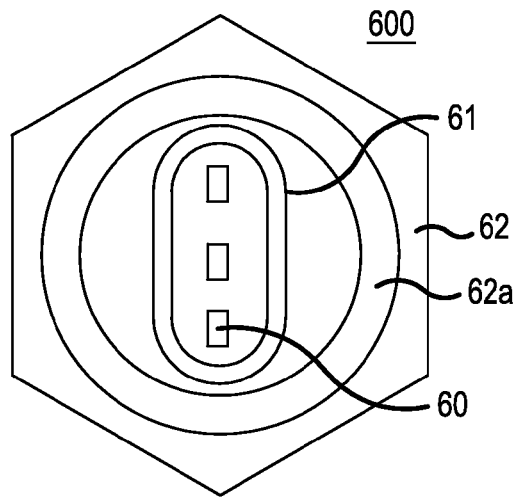
FIGS. 8A and 8B are a plan view and a cross-sectional view of a main part of a second conventional pressure sensor 600.
Figure 8B:
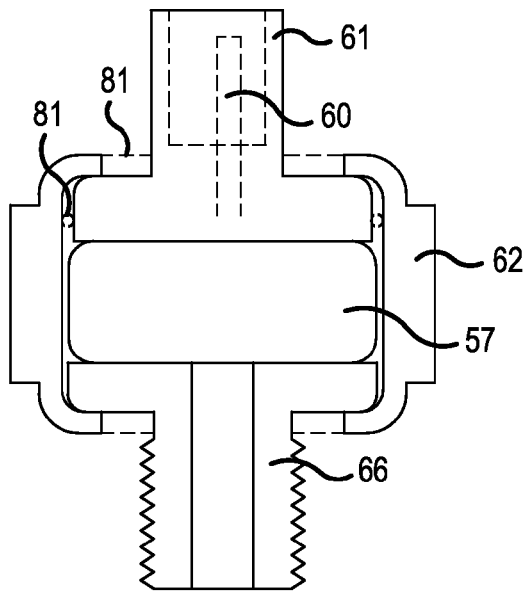
Figure 9A:
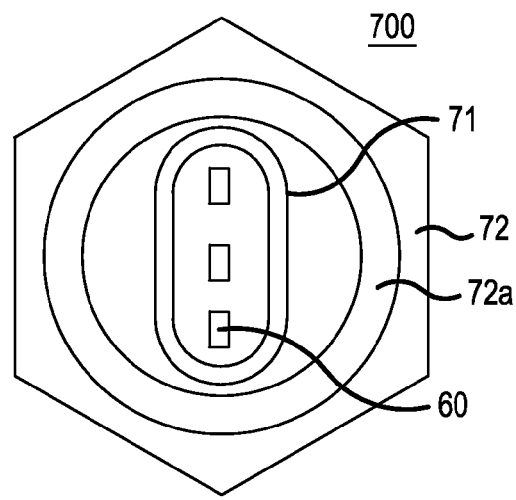
FIGS. 9A and 9B are a plan view and a cross-sectional view of a main part of a third conventional pressure sensor 700.
Figure 9B:
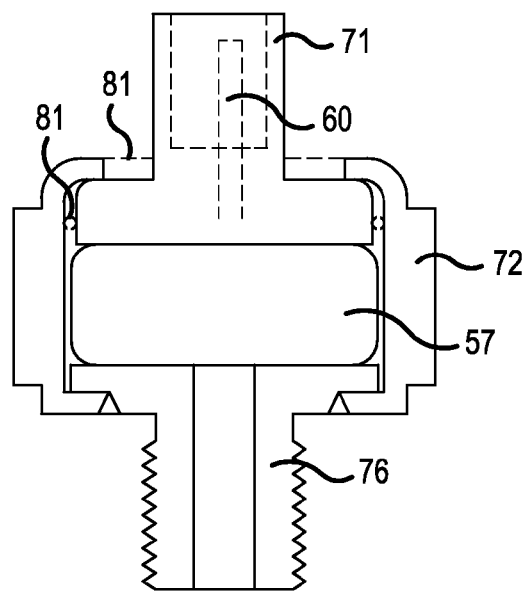
Figure 10:
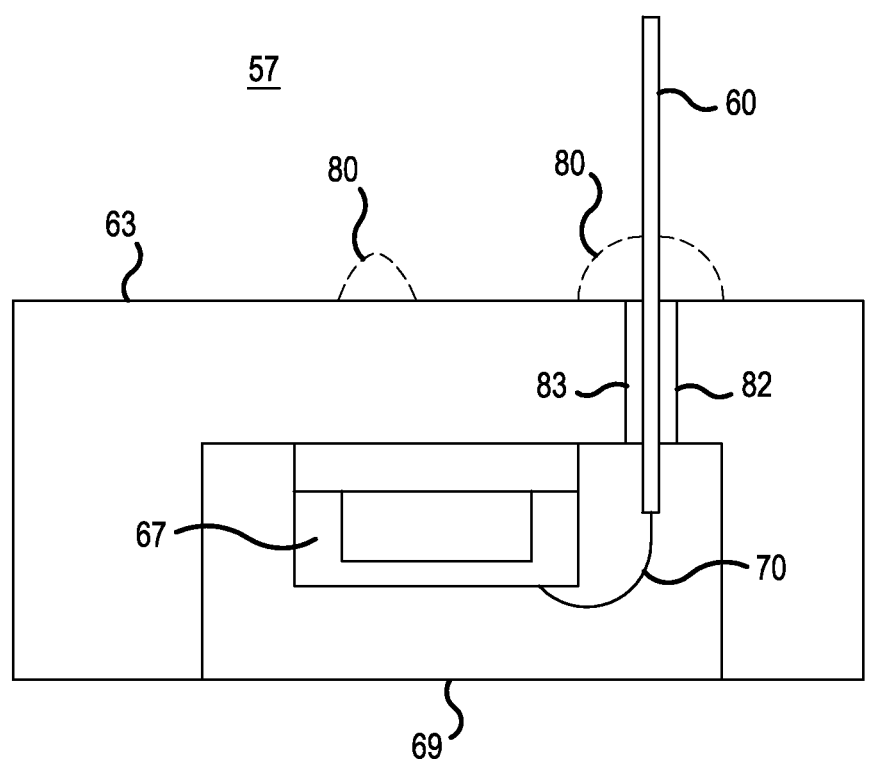
FIG. 10 is a cross-sectional view of a main part of the sense element 57 in FIGS. 7B, 8B and 9B.

A manufacturing method of a physical quantity sensor according to an embodiment of the invention will be described using a case of manufacturing the pressure sensor 100 illustrated in FIGS. 1A and 1B as an example. FIGS. 6A to 6C are cross-sectional views of the main part manufacturing steps, depicting the method of manufacturing the pressure sensor 100 according to an embodiment of this invention in sequence.

First, in FIG. 6A, the socket portion 1 and the nut portion 2 are integrally molded with resin. The resin is, for example, a plastic called PPS (Poly Phenylene Sulfide) or an engineered plastic. In an embodiment, the socket portion 1 and the nut portion 2 may be integrally molded with a material of which mechanical strength is close to metal and has non-thermo-plasticity, which does not deform even at a temperature of around 150° C.

Then, in FIG. 6B, the sense element 7 is fixed to the pedestal 24 of the metal screw portion 6. The sense element 7 may be fixed to the pedestal 24 of the screw portion 6 by laser welding or plasma welding, for example. In the sense element 7, the external lead-out terminal 10 is fixed in advance. Then, in FIG. 6C, the screw portion 6 is inserted into the concave part 3 of the nut portion 2, so that the external lead-out terminal 10 passes through the through hole 11 of the socket portion 1, and the screw portion 6 is fitted to the concave part 3 of the nut portion 2. Then, the side face of the pedestal 24 of the screw portion 6 and the side wall 4 of the opening of the concave part 3 of the nut portion 2 are tightly fixed with the adhesive 5. Further, the adhesive 12 is filled in the through hole 11 of the socket portion 1, so as to tightly fix the external lead-out terminal 10. Thereby the manufacture of the pressure sensor 100 shown in FIGS. 1A and 1B is completed.

As described above, according to this embodiment, effects similar to the cases of the above-described embodiments can be obtained.

Figure 11:
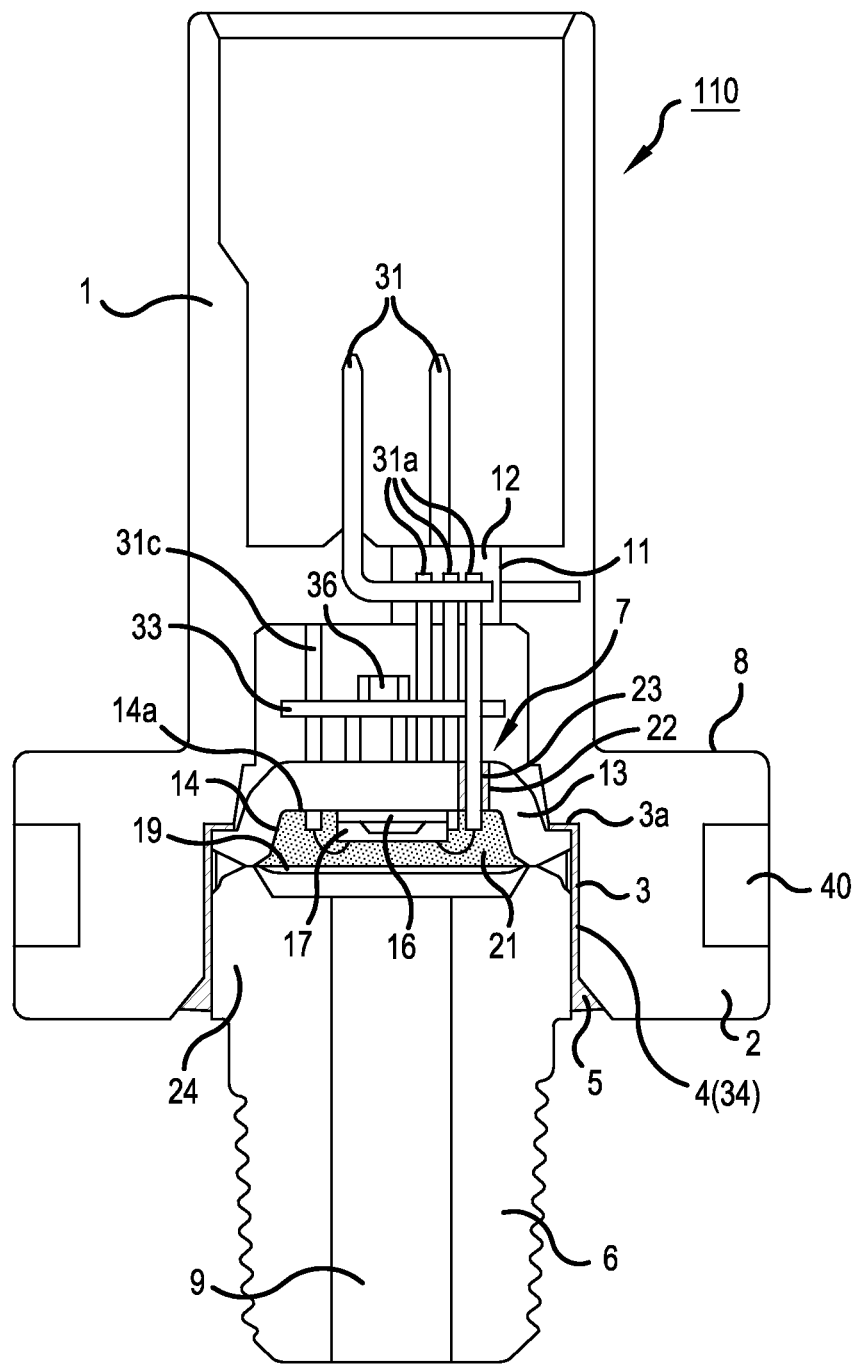
FIG. 11 is a cross-sectional view depicting a configuration of a pressure sensor 110 according to an embodiment of this invention.
Figure 12A:
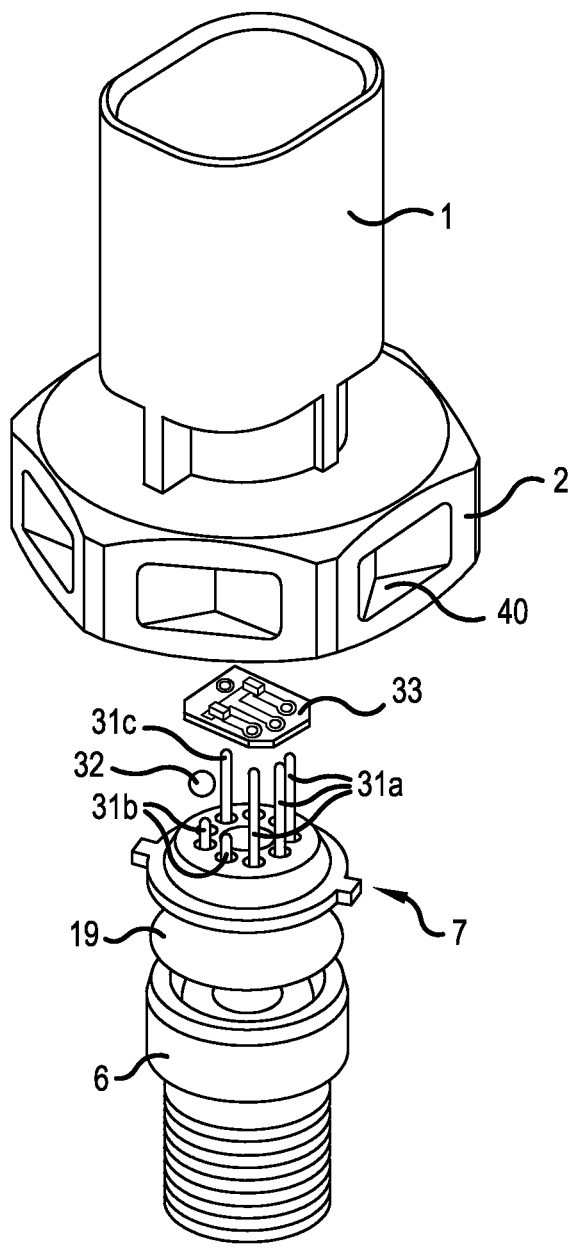
FIGS. 12A and 12B are perspective views depicting a pre-assembly state of the pressure sensor 110 in FIG. 11.
Figure 12B:
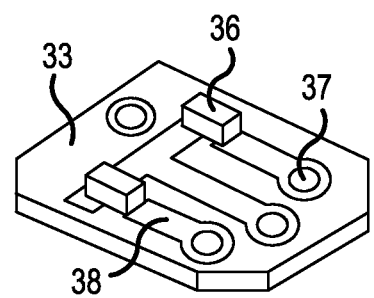

A configuration of a physical quantity sensor according to another embodiment of this invention will be described. FIG. 11 is a cross-sectional view depicting a configuration of a pressure sensor 110 according to an embodiment of the invention. FIGS. 12A and 12B are perspective views depicting a pre-assembly state of the pressure sensor 110 in FIG. 11. FIGS. 13A and 13B are perspective views depicting a configuration of the socket portion 1 of the pressure sensor 110 in FIG. 11. FIG. 14 is a perspective view depicting an internal configuration of the socket portion 1 of the pressure sensor 110 in FIG. 11. A difference of the pressure sensor 110 according to this embodiment is that the concave part 3 of the nut portion 2 includes a base 3a, and an adhesive injection portion (groove) 34 to inject the adhesive 5 is formed from the side wall 4 of the opening of the concave part 3 to the base 3a.

The plurality of adhesive injection portions 34 are disposed on the side wall 4 of the opening of the concave part 3 of the nut portion 2, so that when the screw portion 6 is inserted into the concave part 3 of the nut portion 2, a gap is generated between the side wall 4 of the opening of the concave part 3 of the nut portion 2, and the pedestal 24 of the screw portion 6 and the housing box 13 fixed to the screw portion 6. The adhesive injection portion 34 is a groove that extends from an opening edge on the side opposite to the base 3a of the concave part 3 of the nut portion 2 toward the base 3a. By forming the adhesive injection portion 34, the adhesive 5 injected into the adhesive injection portion 34 can reach the base 3a of the concave part 3 of the nut portion 2 after the screw portion 6 is inserted into the concave part 3 of the nut portion 2. Thereby the base 3a of the concave part 3 and the upper surface of the housing box 13 can be bonded. As a result, the area of adhesion between the concave part 3 of the nut portion 2 and the pedestal 24 of the screw portion 6 and the housing box 13 by the adhesive 5 after solidification can be enlarged, and the fixing strength between the nut portion 2 and the screw portion 6 can be improved.

The fixing strength between the nut portion 2 and the screw portion 6 determines the fixing strength of the sense element 7 with respect to the tightening torque of the screw portion 6. By improving the fixing strength between the nut portion 2 and the screw portion 6 by forming the adhesive injection portion 34 as described above, the sense element 7 can be attached to the measurement object body with certainty, and leakage of the pressure medium can be prevented. Further, if the nut portion 2, which is molded with resin, has a thick wall part, then pits and cavities may form in the nut portion 2. Therefore, a groove 35 of which depth is the height direction of the nut portion 2 may be formed, or a groove 40 may be formed on each surface of the nut portion 2, so that a thick wall part is not formed in the nut portion 2 when the nut portion 2 is molded.

Terminals 31*a* connected to the pressure sensor element 17 are a power supply terminal, a ground terminal and an output terminal. Each terminal 31*a* is connected to each external lead-out terminal 31 disposed in the socket portion 1, respectively, thereby forming an external lead-out terminal. In FIG. 11, one external lead-out terminal 31 is not illustrated, but a same number of external lead-out terminals 31 as the number of terminals 31*a* are disposed according to this embodiment. The terminals 31*b* and 31*c* connected to the pressure sensor element 17 are a characteristic adjustment terminal and a trimming terminal, respectively. The terminal 31*b* is shorter than the terminal 31*a*, for example. A noise countermeasure substrate 33 having a chip capacitor 36 may be disposed between the pressure sensor element 17 and the socket portion 1.

Through holes 37 for the terminal 31*a* to pass through are formed in the noise countermeasure substrate 33, and the noise countermeasure substrate 33 and the terminals 31*a* that pass through the through holes 37 are soldered. A terminal 31*c* having approximately the same length as the terminals 31*a* may be disposed to pass through the through hole 37 of the noise countermeasure substrate 33. The terminal 31*c* has a function to fix the position of the noise countermeasure substrate 33 and to determine the position of the noise countermeasure substrate 33 with respect to the socket portion 1. The chip capacitor 36 is connected to the terminal 31*a* via a wiring pattern 38 of the noise countermeasure substrate 33. The reference numeral 32 denotes a sealing copper wire to block a hole, which is used for injecting such liquid 21 as oil into the sense element 7, by welding.

The insulating member 23 is formed by melting a glass tube. To join the housing box 13, the diaphragm 19 and the pedestal 24 of the screw portion 6, the diaphragm 19 is sandwiched between the pedestal 24 of the screw portion 6 and the housing box 13, and an area around the stacked part of the housing box 13, the diaphragm 19 and the pedestal 24 of the screw portion 6 is welded, for example. To easily perform welding, the distance between the pedestal 24 of the screw portion 6 and the housing box 13 may increase in the outward direction when the diaphragm 19 is sandwiched between the pedestal 24 and the housing box 13, and is secured. Thereby, the housing box 13, the diaphragm 19 and the pedestal 24 of the screw portion 6 can be joined by performing welding only once. The pressure sensor element 17 and the glass substrate 16 are joined by electrostatic joining. The pressure sensor element 17 is fixed to the base 14*a* of the concave part 14 by adhesive (not illustrated) constituting the housing box 13.

The rough surface shown in FIG. 3A may be formed on the side wall of the pedestal 24.

As described above, according to this embodiment, effects similar to the cases of the above-described embodiments can be obtained.

Figure 15:
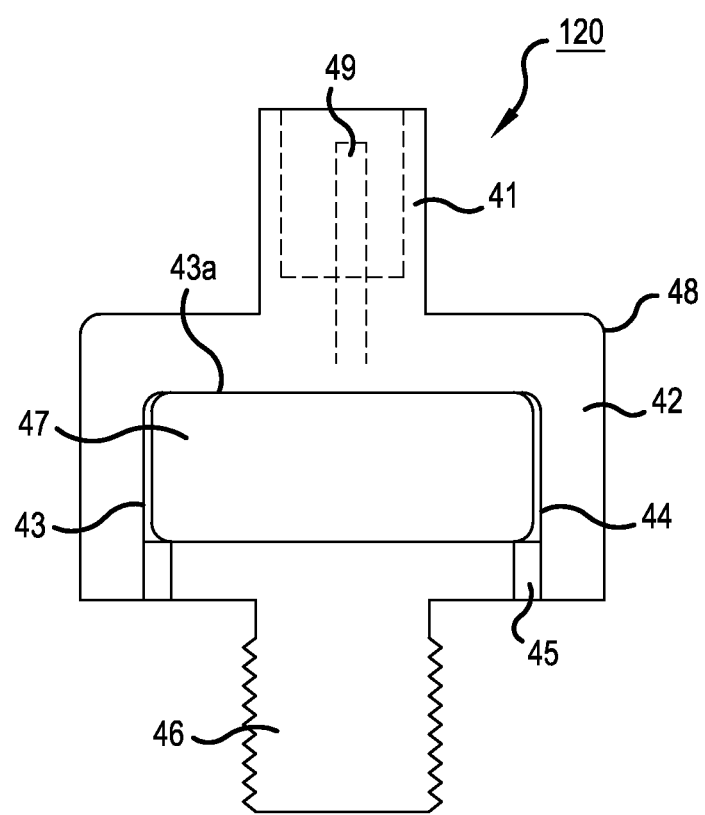
FIG. 15 is a cross-sectional view depicting a configuration of an acceleration sensor 120 according to an embodiment of this invention.

Now a configuration of a physical quantity sensor according to another embodiment of this invention will be described. FIG. 15 is a cross-sectional view depicting a configuration of an acceleration sensor 120 according to an embodiment of the invention. The physical quantity sensor according to this embodiment is the acceleration sensor 120, to which the configuration of the pressure sensor 100 may be applied. A difference of the acceleration sensor 120 of this embodiment from the pressure sensor 100 is that the through hole, to introduce pressure to a screw portion 46 for fixing the sense element 47, is not formed in a concave part 43 of the nut portion 42. The other configuration of a package 48 of the acceleration sensor 120 constituted by the socket portion 41, the nut portion 42 and the screw portion 46, and the internal configuration of the sense element 47 (not illustrated) may be the same as the package and the sense element of the pressure sensors according to the above-described embodiments. The reference numeral 49 denotes an external lead-out terminal, and the reference numerals 43*a* and 44 denote a base and a side wall of the opening of the concave part 43 of the nut portion 42 respectively, and the reference numeral 45 denotes adhesive.

As described above, according to this embodiment, effects similar to the cases of the above-described embodiments can be obtained.

As described above, the physical quantity sensor and the method of manufacturing the physical sensor according to embodiment of the invention are useful for physical quantity sensors including pressure sensors and acceleration sensors, which are used for automobiles, industrial apparatuses, and other suitable apparatuses.

The invention claimed is:

1. A physical quantity sensor, comprising:
   a package including a socket portion, a nut portion, and a screw portion, the screw portion including an introduction hole and a pedestal on one end of the introduction hole; and
   a sense element disposed on the pedestal so as to block the introduction hole, the sense element being housed in a concave part of the nut portion, wherein
   the socket portion and the nut portion are an integrated resin member,
   the screw portion is a metal member,
   an inner side wall of the concave part of the nut portion and a side wall of the pedestal are bonded together with an adhesive, and
   the screw portion and the pedestal are integrally formed.

2. The physical quantity sensor according to claim 1, wherein
   the sense element includes:
   an element configured to sense pressure or acceleration;
   a housing box that houses the element; and
   a terminal electrically connected with the element and disposed penetrating the housing box.

3. The physical quantity sensor according to claim 1, wherein the side wall of the pedestal has a rough surface.

4. The physical quantity sensor according to claim 1, further comprising a groove on the inner side wall of the concave part of the nut portion.

5. The physical quantity sensor according to claim 1, wherein
   a convex part or a concave part is provided on the side wall of the pedestal, and
   a concave part or a convex part, to which the convex part or the concave part on the side wall of the pedestal is fitted, is provided on an inner side wall face of the concave part of the nut portion.

6. The physical quantity sensor according to claim 1, wherein
   a planar shape of the concave part of the nut portion is a polygon, and
   a planar shape of the pedestal is a polygon that is fitted to the concave part of the nut portion.

7. The physical quantity sensor according to claim 1, wherein
   a planar shape of the concave part of the nut portion is a polygon, and
   a planar shape of the sense element is a polygon that is fitted to the concave part of the nut portion.

8. The physical quantity sensor according to claim 7, wherein
   the nut portion and the sense element are bonded together by fitting the concave part of the nut portion to at least a part of the sense element to form a fitted portion, and by an adhesive disposed in a gap formed in the fitted portion.

9. A physical quantity sensor, comprising:
   a package including a socket portion, a nut portion, and a screw portion, the screw portion including a pedestal on one end; and
   a sense element disposed on the pedestal, wherein
   the socket portion and the nut portion are an integrated resin member,
   the screw portion is a metal member,
   an inner side wall of a concave part of the nut portion and a side wall of the pedestal are bonded together with an adhesive, and
   the screw portion and the pedestal are integrally formed.

10. The physical quantity sensor according to claim 9, wherein
    the screw portion includes an introduction hole, and
    the sense element includes:
    a metal diaphragm welded to the pedestal so as to block the introduction hole;
    a metal housing box welded to the diaphragm so as to form a space inside the sense element;
    an element housed in the housing box; and
    a liquid in the space.

11. The physical quantity sensor according to claim 9, wherein
    the side wall of the pedestal has a rough surface.

12. The physical quantity sensor according to claim 9, further comprising
    a groove on the inner side wall of the concave part of the nut portion.

13. The physical quantity sensor according to claim 4, further comprising
    a step on the inner side wall of the concave part of the nut portion.

14. The physical quantity sensor according to claim 13, wherein
    an upper surface of the sense element is bonded to the step with an adhesive.

15. The physical quantity sensor according to claim 12, further comprising
    a step on the inner side wall of the concave part of the nut portion.

16. The physical quantity sensor according to claim 15, wherein
    an upper surface of the sense element is bonded to the step with an adhesive.

17. A method of manufacturing a sensor, comprising:
    integrally molding a socket portion and a nut portion with resin;
    fixing a sense element to a pedestal of a metal screw portion; and
    fitting the metal screw portion to a concave part of the nut portion, and bonding the metal screw portion and the nut portion together with an adhesive,
    wherein the metal screw portion and the pedestal are integrally formed.

18. The method of manufacturing the physical quantity sensor according to claim 17, wherein the sense element is fixed to the surface of the metal screw portion by laser welding or plasma welding.

19. A method of manufacturing a sensor, comprising:
    integrally molding a socket portion and a nut portion with resin;
    fixing a diaphragm and a housing box to a screw portion by welding the screw portion, the diaphragm, and the housing box in a state where the housing box is stacked onto a pedestal of the screw portion via the diaphragm; and
    fitting the screw portion to a concave part of the nut portion, and bonding the screw portion and the nut portion together with an adhesive,
    wherein the screw portion and the pedestal are integrally formed.

* * * * *